(12) United States Patent
Kwon et al.

(10) Patent No.: US 10,462,896 B1
(45) Date of Patent: Oct. 29, 2019

(54) FLEXIBLE DISPLAY DEVICE

(71) Applicant: Samsung Display Co. Ltd., Yongin-si, Gyeonggi-do (KR)

(72) Inventors: Oh June Kwon, Hwaseong-si (KR); Seung Wook Kwon, Hwaseong-si (KR); Hyo Jeong Kwon, Seoul (KR); Doo Hwan Kim, Yongin-si (KR); Min Sang Kim, Suwon-si (KR); Chan Ho Moon, Busan (KR); Won Je Cho, Osan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/383,986

(22) Filed: Apr. 15, 2019

(30) Foreign Application Priority Data

Jul. 17, 2018 (KR) .................. 10-2018-0083080

(51) Int. Cl.
| | |
|---|---|
| *H05K 1/02* | (2006.01) |
| *G06F 1/16* | (2006.01) |
| *G02F 1/1333* | (2006.01) |
| *H01L 27/32* | (2006.01) |
| *H01L 51/00* | (2006.01) |

(52) U.S. Cl.
CPC ....... *H05K 1/028* (2013.01); *G02F 1/133305* (2013.01); *G06F 1/1652* (2013.01); *H01L 27/3244* (2013.01); *H01L 51/0097* (2013.01); *H01L 2251/5338* (2013.01)

(58) Field of Classification Search
CPC .... H05K 1/0277; H05K 1/0278; H05K 1/028; H05K 1/0281; H05K 1/0283
See application file for complete search history.

(56) References Cited

U.S. PATENT DOCUMENTS

| | | |
|---|---|---|
| 9,516,743 B2 | 12/2016 | Kim et al. |
| 9,614,168 B2 | 4/2017 | Zhang et al. |

*Primary Examiner* — Jeremy C Norris
(74) *Attorney, Agent, or Firm* — Cantor Colburn LLP

(57) ABSTRACT

A display device includes a flexible substrate including a bending area corresponding to an area at which the display device is bent, and a first area and a second area which is spaced apart from the first area by the bending area, a display element unit disposed in the first area of the flexible substrate; and a buffer member disposed in the bending area of the flexible substrate. The buffer member in the bending area includes: a first buffer member having a first maximum thickness, and a second buffer member having a second maximum thickness which is smaller than the first maximum thickness. Among the first buffer member and the second member, the first buffer member disposed closer to the first area and the second member disposed closer to the second area.

20 Claims, 12 Drawing Sheets

FLEXIBLE DISPLAY DEVICE

This application claims priority to Korean Patent Application No. 10-2018-0083080, filed on Jul. 17, 2018, and all the benefits accruing therefrom under 35 U.S.C. § 119, the disclosure of which is incorporated herein by reference in its entirety.

BACKGROUND

1. Field

The present disclosure relates to a flexible display device, and more particularly, to a flexible display device having a driving member attached thereto.

2. Description of the Related Art

A flexible display device can be used not only in portable electronic devices such as a mobile phone, a smartphone, a tablet personal computer ("PC"), a smart watch, a watch phone, a mobile communication terminal, an electronic notebook, an electronic book, a portable multimedia player ("PMP"), a navigation device, or an ultra-mobile PC ("UMPC"), but also in various other products such as a television ("TV"), a notebook computer, a monitor, a billboard, or an Internet-of-Things ("IoT") device.

A flexible display device, which is a display device having a display unit, signal wiring and the like formed on a flexible substrate, made of a flexible material such as plastic, so as to be able to display an image even when bent like paper, has attracted attention as a next-generation display device.

The range of application of the flexible display device has diversified from a static computer monitor and a TV to a mobile personal portable device, and research has been conducted on a flexible display device having a relatively large display area and a reduced volume and weight.

SUMMARY

Exemplary embodiments of the present disclosure provide a flexible display device capable of preventing defects by reducing or effectively preventing a flexible substrate or signal wiring from cracking even when bent.

However, exemplary embodiments of the present disclosure are not restricted to those set forth herein. The above and other exemplary embodiments of the present disclosure will become more apparent to one of ordinary skill in the art to which the present disclosure pertains by referencing the detailed description of the present disclosure given below.

According to an exemplary embodiment of the present disclosure, there is provided a display device including a flexible substrate including a bending area corresponding to an area at which the display device is bent, and a first area and a second area which is spaced apart from the first area by the bending area; a display element unit which is controlled to display an image, the display element unit disposed on the flexible substrate in the first area of the flexible substrate; and a buffer member disposed on the flexible substrate in the bending area of the flexible substrate. The buffer member in the bending area includes: a first buffer member having a first maximum thickness, and a second buffer member having a second maximum thickness which is smaller than the first maximum thickness, and among the first buffer member and the second member, the first buffer member disposed closer to the first area and the second member disposed closer to the second area.

In an exemplary embodiment, a display device may further include on a same side of the flexible substrate which is opposite to that on which the display element unit is disposed: a first supporting member coupled to the first area of the flexible substrate; and a second supporting member coupled to the second area of the flexible substrate, a first inner side of the first supporting member facing a second inner side of the second supporting member. The flexible substrate bent at the bending area may dispose along a thickness direction of the display device: the second supporting member overlapping the first supporting member, the first inner side of the first supporting member corresponding to a border between the first area of the flexible substrate and the first buffer member, and the second inner side of the second supporting member corresponding to a border between the second area of the flexible substrate and the second buffer member.

In an exemplary embodiment, the first buffer member may be in contact with the first inner side of the first supporting member, the second buffer member may be in contact with the second inner side of the second supporting member, and a thickness of a portion of the first buffer member which is directly adjacent to and in contact with the first inner side may be greater than a thickness of a portion of the second buffer member which is directly adjacent to and in contact with the second inner side.

In an exemplary embodiment, the first supporting member, the first buffer member, the second buffer member, and the second supporting member may include a same material and form one integral body with one another.

In an exemplary embodiment, the first and second buffer members may further include a moisture permeation preventing material. In the bending area, the first buffer member may cover a portion of the flexible substrate directly adjacent to the first inner side of the first supporting member, and the second buffer member may cover a portion of the flexible substrate directly adjacent to the second inner side of the second supporting member.

In an exemplary embodiment, each of the first and second supporting members may be thicker than each of the first and second buffer members.

In an exemplary embodiment, the flexible substrate bent at the bending area may further dispose: the first buffer member at a bent end of the display device, and a bottom surface of the first supporting member facing a top surface of the second supporting member along the thickness direction of the display device. The first buffer member may extend from the bent end of the display device to dispose a first extension member thereof overlapping the bottom surface of the first supporting member along the thickness direction of the display device.

In an exemplary embodiment, the first maximum thickness of the first buffer member extending to define the first extension member may be greater than a thickness of the first supporting member.

In an exemplary embodiment, the flexible substrate bent at the bending area may further dispose the first extension member of the first buffer member further overlapping the second supporting member along the thickness direction of the display device.

In an exemplary embodiment, on a same side of the flexible substrate on which the display element unit is disposed, the display device may further include a driving member which controls the display element unit to display the image, the driving member disposed in the second area of the flexible substrate; and a circuit board which provides a control signal to the driving member, the circuit board connected to the flexible substrate at the second area thereof to be spaced apart from the driving member in the second area.

In an exemplary embodiment, on a same side of the flexible substrate on which the display element unit is disposed, the display device may further include a third buffer in the first and second areas of the flexible substrate, the third buffer member facing the first and second buffer members in the bending area of the flexible substrate.

In an exemplary embodiment, a thickness of the third buffer member may be smaller than each of the first and second maximum thicknesses of the first and second buffer members, and a material of the third buffer member may differ from materials of the first and second buffer members.

In an exemplary embodiment, a display device includes a flexible substrate including a bending area corresponding to an area at which the display device is bent, and a first area and a second area which is spaced apart from the first area by the bending area; a display element unit which is controlled to display an image, the display element unit disposed on the flexible substrate in the first area of the flexible substrate; a buffer member disposed on the flexible substrate in the bending area of the flexible substrate, the buffer member in the bending area including: a first buffer member having a first maximum thickness, and a second buffer member having a second maximum thickness which is smaller than the first maximum thickness, and among the first buffer member and the second member, the first buffer member disposed closer to the first area and the second member disposed closer to the second area; and on a same side of the flexible substrate which is opposite to that on which the display element unit is disposed: a first supporting member coupled to the first area of the flexible substrate, the first supporting member including a first inner side closest to the bending area being curved to have a first curvature; and a second supporting member coupled to the second area of the flexible substrate, the second supporting member including a second inner side closest to the bending area. The flexible substrate bent at the bending area disposes along a thickness direction of the display device: the second supporting member overlapping the first supporting member, and the curved first inner side of the first supporting member protruding toward the first buffer member.

In an exemplary embodiment, the first buffer member may be in contact with the curved first inner side of the first supporting member, the second buffer member may be in contact with the second inner side of the second supporting member, and a thickness of a portion of the first buffer member which is directly adjacent to and in contact with the curved first inner side may be greater than a thickness of a portion of the second buffer member which is directly adjacent to and in contact with the second inner side.

In an exemplary embodiment, the first supporting member, the first buffer member, the second buffer member, and the second supporting member may include a same material and form one integral body with one another.

In an exemplary embodiment, the first and second buffer members may further include a moisture permeation preventing material. In the bending area, the first buffer member may cover a portion of the flexible substrate directly adjacent to the curved first inner side, and the second buffer member may cover a portion of the flexible substrate directly adjacent to the second inner side.

In an exemplary embodiment, each of the first and second supporting members may be thicker than each of the first and second buffer members.

In an exemplary embodiment, the flexible substrate bent at the bending area may further dispose: the first buffer member at a bent end of the display device, and a bottom surface of the first supporting member facing a top surface of the second supporting member along the thickness direction of the display device. The first buffer member may extend from the bent end of the display device to dispose a first extension member thereof overlapping both the bottom surface of the first supporting member and the top surface of the second supporting member along the thickness direction of the display device, and the first maximum thickness of the first buffer member extending to define the first extension member may be greater than a thickness of the first supporting member.

In an exemplary embodiment, on a same side of the flexible substrate on which the display element unit is disposed, the display device may further include a third buffer member in the first and second areas of the flexible substrate, the third buffer member facing the first and second buffer members in the bending area of the flexible substrate.

In an exemplary embodiment, a thickness of the third buffer member may be smaller than each of the first and second maximum thicknesses of the first and second buffer members, and a material of the third buffer member may differ from materials of the first and second buffer members.

According to the aforementioned and other exemplary embodiments of the present disclosure, a flexible display device capable of reducing or effectively preventing defects by reducing or effectively preventing a flexible substrate or signal wiring from cracking even when bent.

Other features and exemplary embodiments may be apparent from the following detailed description, the drawings, and the claims.

BRIEF DESCRIPTION OF THE DRAWINGS

The above and other features of the present disclosure will become more apparent by describing in detail exemplary embodiments thereof with reference to the attached drawings, in which.

DETAILED DESCRIPTION

Figure 1:
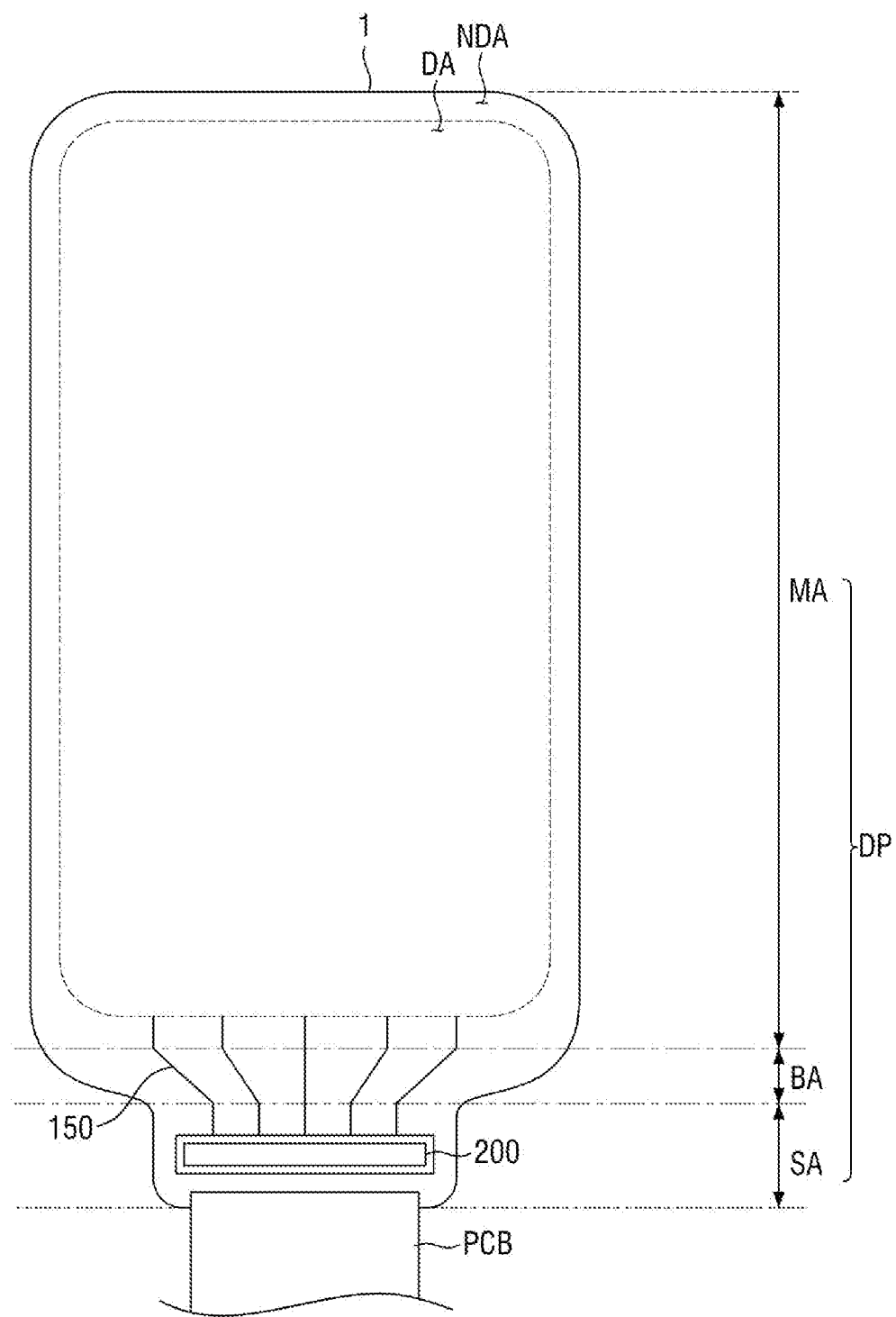
FIG. 1 is a top plan view of an exemplary embodiment of a flexible display device according to the present disclosure.

The advantages and features of the invention and methods for achieving the advantages and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims. Like reference numerals refer to like elements throughout.

An element described as being related to another element such as being "on" another element or "located on" a different layer or a layer, includes both a case where an element is located directly on another element or a layer with no intervening element or layer therebetween and a case where an element is located on another element via another layer or still another element. In contrast, an element described as being is related to another element such as being "directly on" another element or "located directly on" a different layer or a layer, indicates a case where an element is located on another element or a layer with no intervening element or layer therebetween.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

For a flexible display device having a display unit, signal wiring and the like formed on a flexible substrate, made of a flexible material such as plastic, so as to be able to display an image even when bent like paper, cracks may be generated in the flexible substrate and/or the signal wiring for various reasons. Such cracks may undesirably cause defects in a flexible display device.

Figure 2:
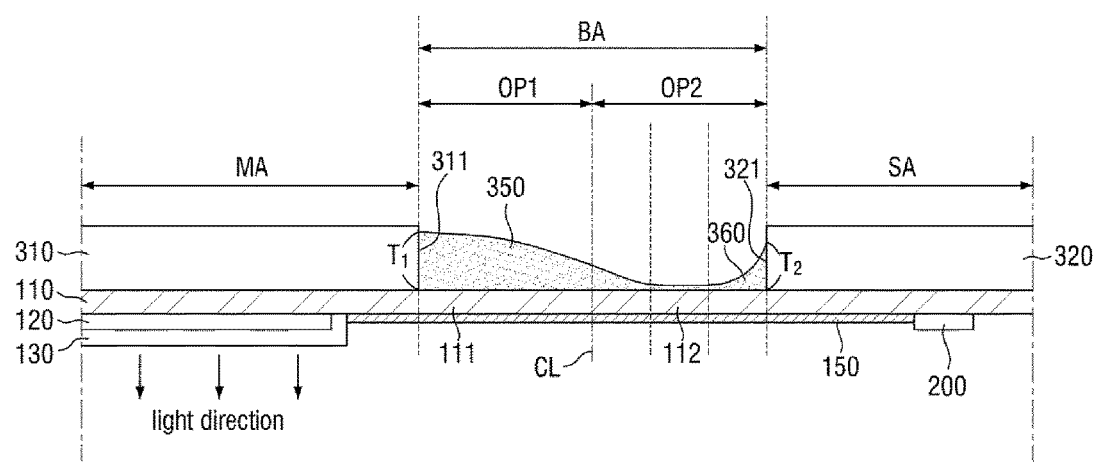
FIG. 2 is a cross-sectional view of an exemplary embodiment of the flexible display device of FIG. 1 in an unbent state.

FIG. 1 is a top plan view of an exemplary embodiment of a flexible display device according to the present disclosure, and FIG. 2 is a cross-sectional view of the flexible display device of FIG. 1 in an unbent or flat state. As an exemplary embodiment of being unbent or flat, the flexible display device and components thereof may be disposed extended in a single plane.

Referring to FIGS. 1 and 2, the flexible display device and components thereof may be disposed in a plane defined by two directions which cross each other. In FIG. 1, the vertical direction may define a first direction while the horizontal direction may represent a second direction which crosses the first direction. In FIG. 2, the vertical direction may define a third direction which crosses each of the first and second directions, to represent a thickness direction of the flexible display device and the components thereof, while the horizontal direction may define the first direction or the second direction. In FIG. 1, the thickness direction is defined into the page view.

Referring to FIGS. 1 and 2, a flexible display device 1 includes a display area DA in which an image is displayed and a non-display area NDA which is disposed at the periphery of the display area DA. The flexible display device 1 may have an overall rectangular shape with right-angled or rounded edges, such as at corners thereof in the top plan view. However, the shape of the display area DA is not particularly limited, and the display rea DA may have a circular shape, an elliptical shape, or various other shapes in the top plan view.

The non-display area NDA is disposed on the periphery of the display area DA. The non-display area NDA may be disposed adjacent to both of opposing relatively short sides of the display area DA. Also, the non-display area NDA may be disposed adjacent not only to both of the opposing relatively short sides, but also to both of opposing relatively long sides of the display area DA, and may be disposed at all the sides of the display area DA to surround the display area DA. That is, the non-display area NDA adjacent to the display area DA may form the borders of the display area DA.

The flexible display device 1 may include a display panel DP, which generates and displays an image such as with light, and a driving member 200, which is attached to the display panel DP and forms pixel circuitry of the display panel DP. The display panel DP may define a display screen of the flexible display device 1. In an exemplary embodiment, an outer surface of the display panel DP may define the display screen of the flexible display device 1. The driving member 200 may include a driver integrated circuit ("IC").

The display panel DP may include components or devices (not illustrated) which are controlled or driven to generate and/or display an image. These components or devices may be disposed in the display area DA. A control or driving signal may be applied to these components or devices to generate and/or display the image at the display area DA.

In an exemplary embodiment, for example, an organic light-emitting diode ("OLED") display panel may be used as the display panel DP. In the description that follows, it is assumed that the display panel DP is an OLED display panel, but the present disclosure is not limited thereto. That is, various other display panels such as a liquid crystal display ("LCD") panel, a field emission display ("FED") panel, or an electrophoretic display panel may be used as the display panel DP.

In an exemplary embodiment, the display panel DP may include a main area MA and a bending area BA at which the display panel DP and components thereof may be bent from a flat state thereof. The main area MA may be flat. In the main area MA, the display area DA and a part of the non-display area NDA may be disposed. It will be understood that as used herein related to bending, a reference to "display panel DP" also applies to the components of the display panel DP.

The bending area BA may be disposed on at least one side of the main area MA. FIGS. 1 and 2 illustrate that there is provided one bending area BA near the lower side of the main area MA in the top plan view. Alternatively, the bending area BA may be disposed near the left, right or upper side of the main area MA in the top plan view. Still alternatively, the bending area BA may be disposed near two or more sides of the main area MA.

The display panel DP at the bending area BA may be bent in an opposite direction to a display direction. As illustrated in FIG. 2, the display direction is indicated downward as 'light direction' in a case where the flexible display device 1 is of a top emission type. In an exemplary embodiment, the non-display area NDA may partially overlap with the main area MA in a thickness direction of the flexible display device 1. By bending at least part of the display panel DP in the non-display area NDA in the opposite direction to the display direction, the bezel of the flexible display device 1 can be reduced when the display panel DP is bent.

The display panel DP may further include a sub-area SA extending from the bending area BA. The main area MA, the bending area BA and the sub-area SA may together define a whole planar area of the display panel DP. When the display panel DP is bent, a plane in which the sub-area SA is disposed may be parallel to a plane in which the main area MA is disposed. When the display panel DP is bent, the sub-area SA may overlap with the main area MA in the thickness direction. In an exemplary embodiment, when the display panel DP is bent, the entire sub-area SA may overlap with the main area MA in the thickness direction. The bending area BA and the sub-area SA may both be included into the non-display area NDA, but the present disclosure is not limited thereto.

The display panel DP may include a pad area disposed in the non-display area NDA. The pad area may be disposed in the sub-area SA, but the present disclosure is not limited thereto. Alternatively, the pad area may be disposed in the main area MA or the bending area BA.

The pad area may include a plurality of pad terminals (not illustrated) through which a control or driving signal is provided to the display panel DP from outside thereof. The pad terminals may be connected to signal wiring 150 extending from the display area DA and into the non-display area NDA. The signal wiring 150 may be connected to the components or devices of the display panel DP described above. The driving member 200 may be attached to the pad terminals. The control or driving signal may be provided through the driving member 200 to the display panel DP from outside thereof. In FIG. 1, the driving member 200 may be considered as corresponding to the pad area without being limited thereto.

The flexible display device 1 may further include a printed circuit board PCB. The printed circuit board PCB may be attached to a part of the non-display area NDA on the outside of the pad area. That is, the pad area to which the driving member 200 is attached may be disposed between the display area DA and the area to which the printed circuit board PCB is attached. The printed circuit board PCB may be attached to a lower part of the sub-area SA. The printed circuit board PCB may be a flexible printed circuit board, but the present disclosure is not limited thereto. The printed circuit board PCB may be connected to the display panel DP via a flexible film.

The flexible display device 1 may include the display panel DP, a back plate (310 and 320), and a buffer member (350 and 360).

The display panel DP may include a flexible substrate 110, which is disposed across the entirety of the display panel DP, a pixel array layer 120 which is disposed on the flexible substrate 110 in the main area MA, and a thin encapsulation layer 130 having a relatively small thickness. The display panel DP may further include the driving member 200, which is disposed on the flexible substrate 110 in the sub-area SA.

The flexible substrate 110 may be a substrate for supporting various elements of the display panel DP and/or the flexible display device 1. The flexible substrate 110 may be disposed across the main area MA, the bending area BA, and the sub-area SA and may be understood as including areas respectively corresponding to those of the main area MA, the bending area BA and the sub-area SA.

The flexible substrate 110 may include or be formed of a soft material. In an exemplary embodiment, for example, the flexible substrate 110 may be a film including one or more material selected from a polyester polymer, a silicone polymer, an acrylic polymer, a polyolefin polymer, and a copolymer thereof. Specifically, the flexible substrate 110 may include one or more material selected from polyethylene terephthalate ("PET"), polybutylene terephthalate ("PBT"), polysilane, polysiloxane, polysilazane, polycarbosilane, polyacrylate, polymethacrylate, polymethylacrylate, polyethylacrylate, polyethylmethacrylate, a cyclic-olefin copolymer ("COC"), a cyclic-olefin polymer ("COP"), polyethylene ("PE"), polypropylene ("PP"), polyimide ("PI"), polymethyl methacrylate ("PMMA"), polystyrene ("PS"), polyacetal ("POM"), polyetheretherketone ("PEEK"), polyester sulfone ("PES"), polytetrafluoroethylene ("PTFE"), polyvinyl chloride ("PVC"), polycarbonate ("PC"), polyvinylidene fluoride ("PVDF"), a perfluoroalkyl polymer ("PFA"), a styrene acrylonitrile copolymer ("SAN"), and a combination thereof.

In some exemplary embodiments, in a case where the flexible display device 1 is implemented as a transparent flexible display device, the flexible substrate 110 may include or be formed of a transparent soft material.

In an exemplary embodiment of manufacturing a flexible display device, the flexible substrate 110 may be formed by applying a plastic material, to a predetermined thickness, on the top surface of a release layer which is disposed on a relatively thick carrier substrate, and curing the plastic material. Here, the carrier substrate may be separated from the flexible substrate 110 by releasing the release layer such as through a laser release process.

The pixel array layer 120 may be provided on the flexible substrate 110 and may be controlled or driven to display an image. Specifically, the pixel array layer 120 may be disposed on the top surface of the flexible substrate 110. The top surface of the flexible substrate 110 may be a surface of the flexible substrate 110 in an emission direction in which light is transmitted in a thickness direction. The definition of the top and bottom surfaces of the flexible substrate 110 may apply throughout the description that follows.

The pixel array layer 120 may be disposed on the flexible substrate 110 in the main area MA and may include a plurality of pixels which are controlled or driven to display an image. Although not specifically illustrated, the pixel array layer 120 may include thin-film transistors ("TFTs"), anode electrodes, an organic light-emitting layer ("EL") and cathode electrodes.

The thin-film transistors may be provided in transistor areas of the pixels disposed on the flexible substrate 110 and may include a plurality of conductive layers and a plurality of insulating layers. Here, the thin-film transistors may be a-Si thin-film transistors, poly-Si thin-film transistors, oxide thin-film transistors or organic thin-film transistors.

The anode electrodes may be provided on the thin-film transistors and may be connected to the thin-film transistors. The anode electrodes may include indium tin oxide ("ITO"), indium zinc oxide ("IZO"), zinc oxide (ZnO) or indium oxide ($In_2O_3$). In a case where the flexible display device 1 is of a top emission type, the anode electrodes may further include silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a combination thereof.

The organic light-emitting layer may be disposed or formed on the anode electrodes. The display panel DP may include a hole injection layer ("HIL") and/or a hole transport layer ("HTL") disposed between the organic light-emitting layer and the anode electrodes and may further include an electron transport layer ("ETL") and/or an electron injection layer ("EIL") disposed between the organic light-emitting layer and the cathode electrodes.

The cathode electrodes may be disposed on the organic light-emitting layer. In an exemplary embodiment, the cathode electrodes may be disposed or formed on the entire organic light-emitting layer. The cathode electrodes may include Li, Ca, LiF/Ca, LiF/Al, Al, Mg, Ag, Pt, Pd, Ni, Au Nd, Ir, Cr, BaF, Ba, or a combination thereof (e.g., the combination of Ag and Mg). In a case where the flexible display device 1 is of a top emission type, a relatively thin conductive material layer may be formed as the cathode electrodes. The cathode electrodes may further include a transparent conductive film disposed on the thin conductive material layer. The transparent conductive film may include indium tin oxide, indium zinc oxide, zinc oxide, or indium tin zinc oxide.

The thin encapsulation layer 130 may be disposed on the pixel array layer 120. The thin encapsulation layer 130, which is for reducing or effectively preventing the infiltration of moisture into the pixels, may be disposed or formed to cover the pixel array layer 120. Although not specifically illustrated, the thin encapsulation layer 130 may be a layer in which at least one inorganic film and at least one organic film are alternately stacked. In an exemplary embodiment, for example, the thin encapsulation layer 130 may include a first inorganic film, an organic film, and a second inorganic film that are sequentially stacked.

The display panel DP may further include a barrier layer (not illustrated) provided on the thin encapsulation layer 130. The barrier layer may reduce or effectively prevent the infiltration of moisture into the pixels. The barrier layer may include a material having a relatively low moisture permeability such as, for example, a polymer material.

The display panel DP may further include a polarization film (not illustrated) disposed on the barrier layer. The polarization film may improve the optical characteristics of the display panel DP by reducing or effectively preventing the reflection of external light.

Figure 3:
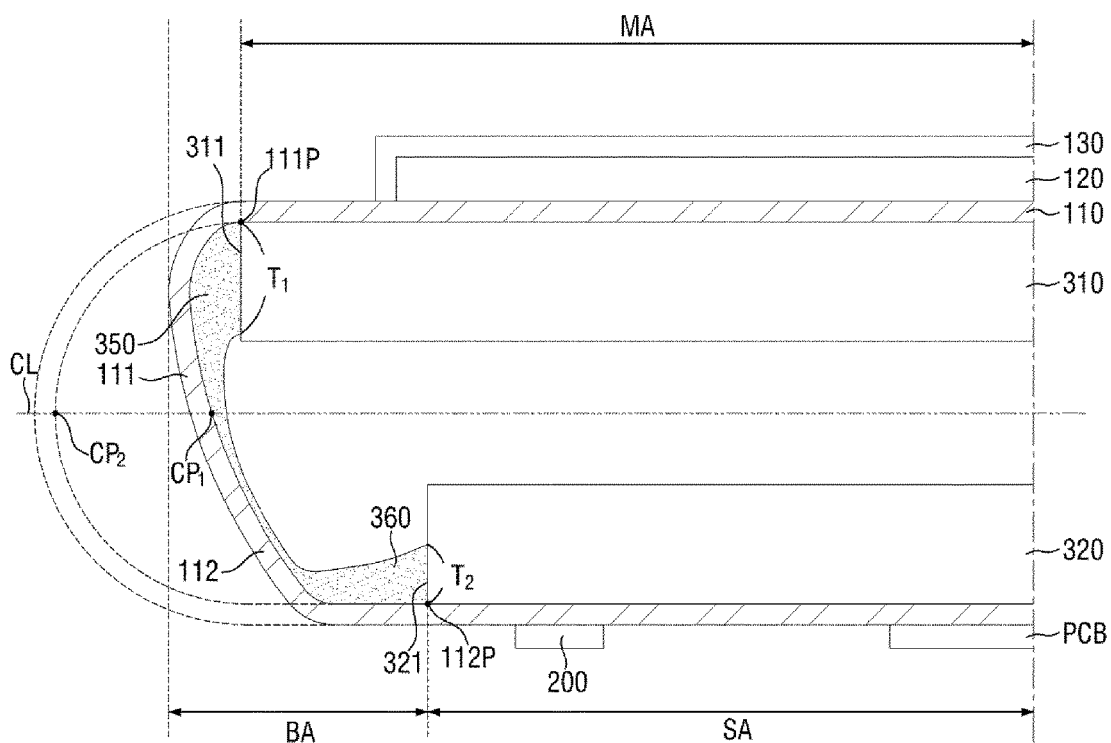
FIG. 3 is a cross-sectional view an exemplary embodiment of the flexible display device of FIG. 1 in a bent state.

As illustrated in FIGS. 2 and 3, the driving member 200 may be a driver integrated chip. In an exemplary embodiment, for example, the driver integrated chip may be attached to the display panel DP, which includes a plastic substrate, in a chip-on-plastic ("COP") manner. The driver integrated chip may be attached to a flexible film in a chip-on-film ("COF") manner to be connected to the display area DA. The driving member 200 may be attached to the pad area of the display panel DP. Specifically, in the pad area of the display panel DP, a plurality of pad terminals (not illustrated) may be provided, and bumps (not illustrated) of the driving member 200 may be electrically connected to the pad terminals of the display panel DP.

The flexible substrate 110 includes the signal wiring 150, which transmits external signals to the display area DA, such as to the pixels of the display panel DP. The signal wiring 150 connected to the pixels of the display panel DP may extend from one side of the display area DA and may be connected to the driving member 200 corresponding to the pad area. That is, the display area DA and the driving member 200 may be electrically connected by the signal wiring 150.

The signal wiring 150 may include or be formed of a conductive material, particularly, a conductive material with excellent ductility, to minimize cracks. In an exemplary embodiment, for example, the signal wiring 150 may include or be formed of a conductive material with excellent ductility such as gold, silver, or aluminum, but the material of the signal wiring 150 is not particularly limited. The signal wiring 150 may include or be formed of various conductive materials that can be used to fabricate components or devices of the display panel DP, like those within the display area DA of the display panel DP. Specifically, the signal wiring 150 may also include or be formed of molybdenum (Mo), chromium (Ti), nickel, neodymium, copper (Cu), or an alloy of silver and magnesium. The signal wiring 150 may be disposed or formed to have a multilayer structure including various conductive materials, for example, a triple-layer structure of titanium/aluminum/titanium, but the present disclosure is not limited thereto.

When the flexible substrate 110 is bent, the flexible substrate 110 may be stressed due to a tensile force. Also, when the flexible substrate 110 is bent, the flexible substrate 110 may be stressed by external shock, for example, by being placed in contact with the corners of the back plate (310 and 320), which will be described later. For these reasons, cracks may be generated in the flexible substrate 110, and as a result, the signal wiring 1:50 on the flexible substrate 110 may be disconnected.

In an asymmetrical bending structure that will be described, the signal wiring 150 is more likely to be disconnected in the main area MA than in the sub-area. SA. This will be described later in detail.

A center line CL is defined for the flexible display device 1. A center line of the display panel DP which will be bent to form the bent flexible display device 1 corresponds to the center line CL thereof. Referring to FIG. 3, for example, the display panel DP and the flexible display device 1 may be bent about the center line CL to dispose an upper thickness of the bent flexible display device 1 above the center line CL, and a lower thickness below the center line CL. The center line CL extends in a direction perpendicular to the flexible substrate 110 at a center of an open area (OP' and OP2 together, hereinafter referenced as "OP"). The flexible substrate 110 may include first and second flexible substrate portions 111 and 112 opposite to each other with respect to the center line CL, which may hereinafter be referred to as first and second flexible substrates 111 and 112. The first flexible substrate 111 may extend from one side of a portion of the flexible substrate 110 in the main area MA and into the bending area. BA to be in contact with the second flexible substrate 112. The second flexible substrate 112 may be in contact with the first flexible substrate 111 and may extend from the first flexible substrate 111 in the bending area BA to be in contact with a portion of the flexible substrate HO in the sub-area SA.

The back plate (310 and 320) may be disposed on the bottom surface of the flexible substrate 110 and may support the display panel DP including the flexible substrate 110. In an exemplary embodiment of manufacturing a flexible display device, the back plate (310 and 320) may include or be formed by a lamination process following a laser release process for separating a carrier substrate from the flexible substrate 110. The back plate (310 and 320) may include a thermoplastic material. In an exemplary embodiment, for example, the back plate (310 and 320) may include a polyacrylic material such as polyethylene terephthalate, polycarbonate, polyether sulfone, polyethylene naphthalate ("PEN"), or polynorbornene ("PNB"). In an exemplary embodiment, for example, the back plate (310 and 320) may be a thermoplastic film.

The back plate (310 and 320) may include first and second back plates 310 and 320, respectively. The first and second back plates 310 and 320 may be flat plates. The first back plate 310 may be disposed on a part of the bottom surface of the flexible substrate 110 overlapping with the main area MA in the thickness direction. In an exemplary embodiment, for example, the first back plate 310 may overlap with the main area MA and may support the pixel array layer 120 in the main area MA, thereby maintaining the pixel array layer 120 to be flat.

The second back plate 320 may be disposed on a part of the bottom surface of the flexible substrate 110 overlapping with the sub-area SA in the thickness direction. The second back plate 320 may be disposed below the first back plate 310 along the thickness direction when the flexible substrate 110 is bent as shown in FIG. 3. In an exemplary embodiment, for example, the second back plate 320 may overlap with the sub-area SA and may support the signal wiring 150 and the driving member 200 in the sub-area SA, thereby maintaining one end of the flexible substrate 110 in the sub area SA to be flat.

The first and second back plates 310 and 320 are illustrated as not overlapping with the bending area BA, but the present disclosure is not limited thereto. Alternatively, a part of the first back plate 310 may overlap with the bending area BA.

The first back plate 310 may include a first inner side 311 overlapping or aligned with the border between the main area MA and the first flexible substrate 111 in the thickness direction. The second back plate 320 may include a second inner side 321 overlapping or aligned with the border between the second flexible substrate 112 and the sub-area SA in the thickness direction.

The first and second inner sides 311 and 321 of the first and second back plates 310 and 320 are illustrated as being straight, rather than curved, but the present disclosure is not limited thereto. Alternatively, one or more among the first and second inner sides 311 and 321 may be curved with a predetermined curvature.

The back plate (310 and 320) may include or define the open area OP. The open area OP may be an area of the flexible substrate 110 where the back plate (310 and 320) is not disposed. The open area OP may overlap with the bending area BA in the thickness direction. The open area OP may have the same size as the bending area BA, such as along the first and/or second directions. The open area OP may be disposed between the first and second back plates 310 and 320. That is, the first and second back plates 310 and 320 may be spaced apart from each other by the open area OP.

The open area OP may include first and second open areas OP1 and OP2. The first open area OP1 may be closer to the main area MA than to the sub-area SA, and the second open area OP2 may be closer to the sub-area SA than to the main area MA. The first open area OP11 may be adjacent to the first back plate 310. The second open area OP2 may be adjacent to the second back plate 320. The first and second back plates 310 and 320 may be the same distance apart from the center line CL.

At the open area OP, the flexible display device 1 may be bent to have a predetermined curvature. The open area OP of the back plate (310 and 320) is illustrated as having the same size as the bending area BA, but the present disclosure is not limited thereto. Alternatively, the open area OP may have a larger or smaller size than the bending area BA.

The buffer member (350 and 360) may be disposed to overlap with a part of the bottom surface of the flexible substrate 110 in the bending area BA. The buffer member (350 and 350) may include first and second buffer members 350 and 360. The first buffer member 350 may be disposed on the bottom surface of the first flexible substrate 111, such as being disposed directly on the bottom surface of the first flexible substrate 111, and may be provided in the first open area OP1. The first buffer member 350 may be disposed adjacent to the main area MA.

The second buffer member 360 may be disposed on the bottom surface of the second flexible substrate 112, such as being disposed directly on the bottom surface of the second flexible substrate 112, and may be provided in the second open area OP2. The second buffer member 360 may be disposed adjacent to the sub-area SA.

The first buffer member 350 may be in contact with the first back plate 310. The second buffer member 360 may be in contact with the second back plate 320. Specifically, the first buffer member 350 may be in contact with the first inner side 311 of the first back plate 310 and with the first flexible substrate 111. The second buffer member 360 may be in contact with the second inner side 321 of the second back plate 320 and with the second flexible substrate 112. As will be described later, a cross-sectional thickness of a part of the first buffer member 350 in contact with the first inner side 311 of the first back plate 310 may be greater than a cross-sectional thickness of a part of the second buffer member 360 in contact with the second inner side 321 of the second back plate 320.

The first inner side 311 of the first back plate 310 may be provided at the open area OP and may overlap with the border between the main area MA and the bending area BA of the flexible substrate 110, and the second inner side 321 of the second back plate 320 may be provided in the open area OP to be spaced apart from the first inner side 311 of the first back plate 310 in a direction toward the sub-area SA and may overlap with the border between the sub-area SA and the bending area BA of the flexible substrate 110. However, the present disclosure is not limited to this. That is, the first inner side 311 of the first back plate 310 and the second inner side 321 of the second back plate 320 may be disposed in the main area MA and the sub-area SA, respectively, or may both be disposed in the bending area BA.

The first and second buffer members 350 and 360 may include a thermoplastic material. In an exemplary embodiment, for example, the first and second buffer members 350 and 360 may include a polyacrylic material such as polyethylene terephthalate, polycarbonate, polyether sulfone, polyethylene naphthalate, or polynorbornene. In an exemplary embodiment, for example, the first and second buffer members 350 and 360 may be thermoplastic films. The material of the first and second buffer members 350 and 360 may be the same as the material of the first and second back plates 310 and 320. That is, the first and second buffer members 350 and 360 may be formed as one integral body with the first and second back plates 310 and 320, but the present disclosure is not limited thereto. As one integral body, one or more among the first and second buffer members 350 and 360 and the first and second back plates 310 and 320 may extend or protrude to define one or more of the others among the first and second buffer members 350 and 360 and the first and second back plates 310 and 320. Alternatively, the material of the first and second buffer members 350 and 360 may be different from the material of the first and second back plates 310 and 320. Also, the first and second buffer members 350 and 360 may include different materials or the same material.

The cross-sectional thickness of the first and second buffer members 350 and 360 may be smaller than those of the first and second back plates 310 and 320 so as not to increase the total thickness of the flexible display device 1, but the present disclosure is not limited thereto. That is, the maximum cross-sectional thickness of the first and second buffer members 350 and 360 may be smaller than the minimum cross-sectional thickness of the first and second back plates 310 and 320. Alternatively, the cross-sectional thickness of the first and/or second buffer members 350 and 360 may be greater than the thickness of the first and second back plates 310 and 320. In an exemplary embodiment, for example, the thickness of the first buffer member 350 may be greater than the thickness of the back plate (310 and 320), and the thickness of the second buffer member 360 may be smaller than the thickness of the back plate (310 and 320). Such thicknesses may be considered across an entirety of the buffer members 350 and 360, or at portions thereof closest to and directly adjacent to the back plate (310 and 320).

The first and second buffer members 350 and 360 may have the same width taken along the first and/or second directions. The width of the first and second buffer members 350 and 360 may be taken between the center line CL and a respective back plate (310 or 320). At a portion in contact with the first back plate 310, the first buffer member 350 may have a first thickness $T_1$ defined by a surface furthest from the first flexible substrate 111. At a portion in contact with the second back plate 320, the second buffer member 360 may have a second thickness $T_2$ defined by a surface furthest from the second flexible substrate 112. The first thickness $T_1$ may be the maximum thickness of the overall first buffer member 350. The second thickness $T_2$ may be the maximum thickness of the overall second buffer member 360. The first thickness $T_1$ may be greater than the second thickness $T_2$.

Along the first and/or second directions, the average thickness of the first buffer member 350 may be greater than the average thickness of the second buffer member 360. Also, the volume of the first buffer member 350 may be greater than the volume of the second buffer member 360, where volumes are defined by a product of a thickness dimension, a first direction dimension and a second direction dimension. The contact area between the first buffer member 350 and the bottom surface of the flexible substrate 110 is the same as the contact area between the second buffer member 360 and the bottom surface of the flexible substrate 110, such as considering the buffer members 350 and 360 symmetrically disposed about the center line. Since the contact area between the first buffer member 350 and the bottom surface of the flexible substrate 110 is the same as the contact area between the second buffer member 360 and the bottom surface of the flexible substrate 110, the volume of the first and second buffer members 350 and 360 may be defined by or comparable with the average thickness of the first and second buffer members 350 and 360. The volume (or average thickness) of the first buffer member 350 in the first open area OP1 may be asymmetrical with those of the second buffer member 360 in the second open area OP2, with respect to the center line CL.

The first thickness $T_1$ may be smaller than the thickness of the first back plate 310. The second thickness $T_2$ may be smaller than the thickness of the second back plate 320. In a case where the second buffer member 360 is not disposed in the second open area OP2, the second thickness $T_2$ may be zero, but the present disclosure is not limited thereto. Alternatively, the first thickness $T_1$ may be greater than the thickness of the first back plate 310, in which case, the first buffer member 350 may be disposed on the top surface of the first back plate 310 to be in contact with, and cover, the top surface of the first back plate 310 at the first inner side 211.

The first and second buffer members 350 and 360 may further include a moisture permeation preventing material. The moisture permeation preventing material may be disposed or formed as an inorganic film or an organic film, but the invention is not limited to thereto. Alternatively, the moisture permeation preventing material may be formed as a stack of an inorganic film and an organic film. The first buffer member 350 may cover an area in which the first inner side 311 and the first flexible substrate 111 are in contact with each other, and the second buffer member 360 may cover an area in which the second inner side 321 and the second flexible substrate 112 are in contact with each other. That is, the penetration of moisture into the flexible substrate 110 can be effectively prevented by the first and second buffer members 350 and 360, and peeling of the back plate (310 and 320) from the flexible substrate 110 can be reduced or effectively prevented. In an exemplary embodiment, for example, the moisture permeation preventing material may include a silicone material with excellent thermal stability, excellent adhesiveness, and an excellent moisture permeation prevention function.

The arrangement of the first and second back plates 310 and 320 and the change of the curvature of the flexible substrate 110 when the flexible display device 1 is bent will hereinafter be described with reference to FIGS. 3 and 4.

Figure 4:
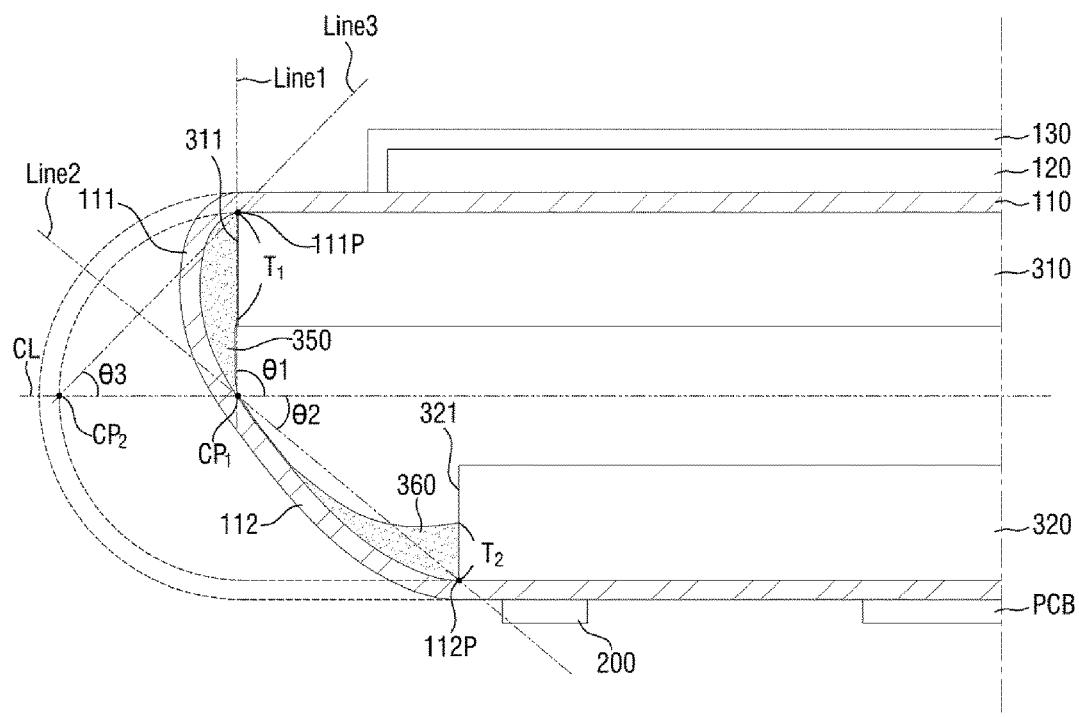
FIG. 4 is a detailed cross-sectional view of the flexible display device of FIG. 3.

FIG. 3 is a cross-sectional view of an exemplary embodiment of the flexible display device of FIG. 1 in a bent state, and FIG. 4 is a detailed cross-sectional view of the bent flexible display device of FIG. 3. The bent flexible display device of FIGS. 3 and 4 are each formed by the flexible display device of FIG. 2 which is bent. For convenience of illustration, the signal wiring 150 shown in FIG. 2 is omitted from FIGS. 3 and 4.

Referring to FIG. 3, when the flexible display device 1 is bent, a part of the bending area BA may overlap with the main area MA in the thickness direction. That is, dead space in the bent flexible display device 1 can be reduced by reducing the size of the bending area BA disposed outside of the main area MA of the flexible display device 1 along the direction in which the bending area BA and the main area MA are arranged, and making the bending area BA overlap with the main area MA along the thickness direction.

In the bent flexible display device 1, the second back plate 320 may be disposed below the first back plate 310 in the thickness direction.

Although not specifically illustrated, the bent flexible display device 1 may further include heat dissipation sheets, cushion sheets, a graphite layer, and a plurality of adhesive layers between the first and second back plates 310 and 320 which are disposed facing each other as illustrated in FIG. 3.

The heat dissipation sheets may be disposed on the back plate (310 and 320). Each of the heat dissipation sheets may have a stack of multiple layers. Each of the heat dissipation sheets may include two layers, and the two layers may be disposed on the first and second back plates 310 and 320. The heat dissipation sheets may include a metal material. In an exemplary embodiment, for example, the heat dissipation sheets may be formed as relatively thin copper sheets, but the present disclosure is not limited thereto. The material of the heat dissipation sheets may be appropriately chosen. Since a metal material has excellent thermal conductivity, the heat dissipation sheets, which include or are formed of a metal material, can improve the thermal conductivity of the flexible display device 1. Accordingly, heat generated in the flexible display device 1 can be efficiently released, and as a result, the heat dissipation efficiency of the flexible display device 1 can be improved.

The cushion sheets may be disposed on the heat dissipation sheets. The cushion sheets may be disposed between the heat dissipation sheets. Two cushion sheets may be provided and may be disposed to be spaced apart from each other in a direction in which the flexible substrate 110 extends. The cushion sheets may include or be formed as elastic members. In an exemplary embodiment, for example, the cushion sheets may include or be formed of a material such as polyurethane and may thus be able to absorb shock from the outside or the inside thereof. In an exemplary embodiments, the cushion sheets may be shock mitigation layers. Accordingly, the durability of the flexible display device 1 can be further improved. However, the material of the cushion sheets is not particularly limited. That is, the material of the cushion sheets may be appropriately chosen from among a variety of elastic materials.

The graphite layer may be disposed between the two cushion sheets, but the present disclosure is not limited thereto. The graphite layer may be disposed on the cushion sheets. The graphite layer may include carbon powder and may thus improve thermal conductivity. Accordingly, the thermal conductivity of the flexible display device 1 can be improved, and heat generated in the flexible display device 1 can be efficiently released.

The heat dissipation sheets, the cushion sheets, and the graphite layer may be bonded to one another via adhesive layers, but the present disclosure is not limited thereto. The heat dissipation sheets, the cushion sheets, and the graphite layer may be placed in contact with one another without any layers disposed therebetween. The heat dissipation sheets may be attached to the first and second back plates 310 and 320 via adhesive layers.

As illustrated in FIG. 3, an end of the bent flexible display device 1 is disposed at the left of the view. With reference to the end of the bent flexible display device 1, the second inner side 321 of the second back plate 320 may be disposed further inside than the first inner side 311 of the first back plate 310. That is, a portion the flexible display device 1 at the first inner side 311 of the first back plate 310 may define a maximum dimension of the bending area BA which is visible at an emission side of the flexible display device 1, since remaining portions of the flexible display device 1 are disposed further inside this portion of the flexible display device 1. This maximum dimension of the bending area BA which is visible at an emission side of the flexible display device 1 may define a bezel width of the flexible display device 1.

Specifically, as illustrated in FIG. 4, the first inner side 311 of the first back plate 310 may include a first contact point 111P where the first inner side 311 of the first back plate 310 is in contact with the first flexible substrate 111, and the second inner side 321 of the second back plate 320 may include a second contact point 112P where the second inner side 321 of the second back plate 320 is in contact with the second flexible substrate 112. The flexible substrate 110 may include a first intersection point $CP_1$ where the flexible substrate 110 intersects the center line CL.

As a dotted line feature in FIGS. 3 and 4, the flexible substrate 110 may be bent symmetrically when the inner side 311 of the first back plate 310 and the second inner side 321 of the second back plate 320 overlap or align with each other in the thickness direction. When the flexible substrate 110 is bent symmetrically, as illustrated by the dotted line feature in FIGS. 3 and 4, the flexible substrate 110 may include a second intersection point $CP_2$ where the flexible substrate 110 intersects the center line CL.

An extension line connecting the first contact point 111P and the first intersection point $CP_1$ may form a first line Line1. An extension line connecting the second contact point 112P and the first intersection point $CP_1$ may form a second line Line2. An extension line connecting the first contact point 111P and the second intersection point $CP_2$ may form a third line Line3.

The first line Line1 may form a first average bending angle θ1 with the center line CL. The second line Line2 may form a second average bending angle θ2 with the center line CL. The third line Line3 may form a third average bending angle θ3 with the center line CL. The first, second, and third average bending angles θ1, θ2, and θ3 may all be acute angles. The tangent values of the first, second, and third average bending angles θ1, θ2, and θ3 may form an average bending slope. Accordingly, the first flexible substrate 111 may have the first average bending angle θ1 and a first average bending slope (SLOPE 1), and the second flexible substrate 112 may have the second average bending angle θ2 and a second average bending slope (SLOPE 2).

In an exemplary embodiment, the first average bending angle θ1 may be greater than the second and third average bending angles θ2 and θ3, the second average bending angle θ2 may be smaller than the first and third average bending angles θ1 and θ3, and the third average bending angle θ3 may be smaller than the first average bending angle θ1 and may be greater than the second average bending angle θ2. Similarly, the first average bending slope (SLOPE 1) may be greater than the second and third average bending slopes (SLOPE 2 and SLOPE 3), the second average bending slope (SLOPE 2) may be smaller than the first and third average bending slopes (SLOPE 1 and SLOPE 3), and the third average bending slope (SLOPE 3) may be smaller than the first average bending slope (SLOPE 1) and may be greater than the second average bending slope (SLOPE 2). However, the present disclosure is not limited to this. Alternatively, the second average bending slope (SLOPE 2) may become greater than the third average bending slope (SLOPE 3) depending on the degree to which the second back plate 320 is recessed in a direction away from the end of the bent flexible display device 1.

The first flexible substrate 111 may have a first average curvature (CV1). The second flexible substrate 112 may have a second average curvature (CV2). Since the first average bending slope (SLOPE 1) is greater than the second and third average bending slopes (SLOPE 2 and SLOPE 3), the first average curvature (CV1) may be greater than the second and third average curvatures (CV2 and CV3). The second average curvature (CV2) may be smaller than the first and third average curvatures (CV1 and CV3). The third average curvature (CV3) may be smaller than the first average curvature (CV1) and may be greater than the second average curvature (CV2).

Since the first and second flexible substrates 111 and 112 have asymmetrical average bending angles, asymmetrical average bending slopes, and asymmetrical average curvatures, the flexible substrate 110 may be bent asymmetrically. When the flexible substrate 110 is bent asymmetrically, a part of the bending area BA which is outside of the main area MA in a flat state of the flexible display device 1, may be disposed to overlap the main area MA in a bent state of the flexible display device. As a result, the bezel width of the flexible display device 1 can be reduced. Accordingly, an essentially bezel-less flexible display device can be provided.

However, the stress applied to the first flexible substrate 111 may be greater when the flexible substrate 110 is bent asymmetrically than when the flexible substrate 110 is bent symmetrically. Also, the stress applied to the first flexible substrate 111 may be greater than the stress applied to the second flexible substrate 112.

Since the average bending angle, the average bending slope, and the average curvature of the first flexible substrate 111 are greater than the average bending angle, the average bending slope, and the average curvature of the second flexible substrate 112, the first flexible substrate 111 may be bent to a greater extent than the second flexible substrate 112. Accordingly, when the flexible substrate 110 is bent, the first flexible substrate 111 may receive more stress than the second flexible substrate 112. Also, since the contact force between the first flexible substrate 111 and the first contact 111P of the first inner surface 311 of the first back plate 310 is greater than the contact force between the second flexible substrate 112 and the second contact point 112P of the second inner surface 321 of the second back plate 320, the first flexible substrate 111 may receive more stress than the second flexible substrate 112. That is, the stress applied to the flexible substrate 110 may be greater in the first flexible substrate 111 than in the second flexible substrate 112. As a result, cracks may be generated in the signal wiring 150 on the first flexible substrate 111, and eventually, the signal wiring 150 may be disconnected.

However, since the buffer member (350 and 360) is applied asymmetrically to the flexible substrate 110, the stress caused by the asymmetric bending of the flexible substrate 110 can be alleviated. In addition, the buffer member (350 and 360) can reduce or effectively prevent peeling of the flexible substrate 110 and the back plate (310 and 320) from each other, and can also reduce or effectively prevent the penetration of moisture between the flexible substrate 110 and the back plate (310 and 320). Specifically, since the average thickness of the first buffer member 350 and the volume of the first buffer member 350 which is in contact with the flexible substrate 110 are greater than the average thickness of the second buffer member 360 and the volume of the second buffer member 360 which is in contact with the flexible substrate 110, the first buffer member 350 can properly perform a buffer function while guiding the bending of the first flexible substrate 111, which receives more stress than the second flexible substrate 112. Accordingly, a reliable flexible display device can be provided by reducing or effectively preventing the disconnection of the signal wiring 150.

Figure 5A:
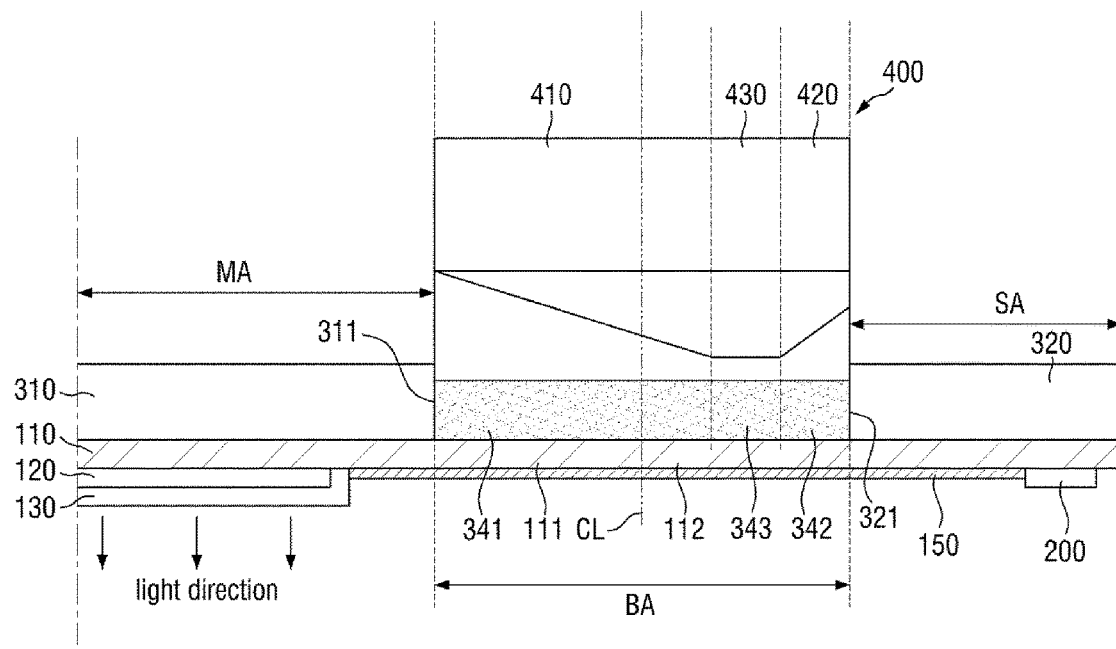
FIGS. 5A and 5B are cross-sectional views illustrating an exemplary embodiment of a method of forming a buffer member in a bending area of a flexible display device according to the present disclosure.
Figure 5B:
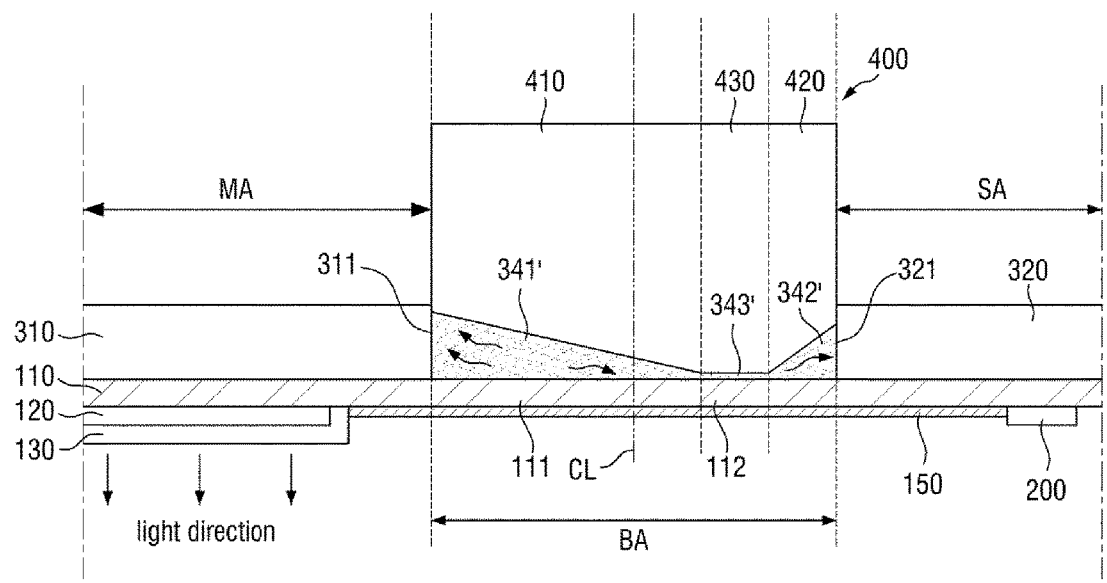

FIGS. 5A and 5B are cross-sectional views illustrating the formation of the buffer member (350 and 360) in the bending area BA. The step of forming the buffer member (350 and 360) in the bending area BA will hereinafter be described with reference to FIGS. 5A and 5B.

Referring to FIG. 5A, a heating block 400 may be disposed on a preliminary buffer member in the bending area BA. The heating block 400 may include first, second, and third heating areas 410, 420, and 430. The first heating area 410 may be an area on the left side of the heating block 400. The second heating area 420 may be an area on the right side of the heating block 400. The third heating area 430 may be an area between the first and second heating areas 410 and 420. The preliminary buffer member may include first, second, and third buffer areas 341, 342 and 343. The first buffer area 341 may be an area on the left side of the preliminary buffer member. The second buffer area 342 may be an area on the right side of the preliminary buffer member (341, 342 and 343). The third buffer area 343 may be an area between the first and second buffer areas 341 and 342. The first, second, and third buffer areas 341, 342, and 343 of the preliminary buffer member (341, 342 and 343) may have substantially the same thickness taken from the flexible substrate 110, before being in contact with the heating block 400. After contacting by the heating block 400, the first, second, and third buffer areas 341, 342, and 343 of the preliminary buffer member may have different thicknesses.

The first and second heating areas 410 and 420 may have a smaller thickness than the third heating area 430. That is, the third heating area 430 may protrude toward the flexible display device 1 further than the first and second heating areas 410 and 420. The third heating area 430 may have a flat surface area having a predetermined width. The average thickness of the first heating area 410 may be smaller than the average thickness of the second heating area 420. The average thickness of the second heating area 420 may be greater than the average thickness of the first heating area 410.

The first heating area 410 may contact with the first buffer area 341. The second heating area 420 may contact with the second buffer area 342. The third heating area 430 may contact with the third buffer area 343. Specifically, after contacting the heating block 400, the first buffer area 341 may become thicker than the second buffer area 342. Also, the first buffer area 341 may have a greater width along the horizontal direction in FIG. 5A than the second buffer area 342.

When placed in contact with the heating block 400, which has a predetermined shape, the preliminary buffer member (341, 342 and 343) may be melted by the thermal energy of the heating block 400 and may be molded into a shape corresponding to the shape of the heating block 400.

Referring to FIG. 5B, which shows a process of placing the heating block 400 and the preliminary buffer member (341, 342 and 343) in contact with each other, parts the preliminary buffer member (341, 342 and 343) may be melted in the order they are placed in contact with the heating block 400. The melted preliminary buffer member (341, 342 and 343) may have fluid mobility, and as a result, a fine flow may be generated in the preliminary buffer member (341, 342 and 343). The fluid mobility of the melted preliminary buffer member (341, 342 and 343) may vary depending on the pressing force of the heating block 400 against the preliminary buffer member (341, 342 and 343) and/or the temperature of the heating block 400. Specifically, the greater the pressing force of the heating block 400, the greater the fluid mobility of the melted preliminary buffer member (341, 342 and 343). On the contrary, the smaller the pressing force of the heating block 400, the smaller the fluid mobility of the melted preliminary buffer member (341, 342 and 343). Also, the higher the temperature of the heating block 400, the greater the fluid mobility of the melted preliminary buffer member (341, 342 and 343). On the contrary, the lower the temperature of the heating block 400, the smaller the fluid mobility of the melted preliminary buffer member (341, 342 and 343).

In this manner, the melted preliminary buffer member (341, 342 and 343) may be formed into the shape of the buffer member (350 and 360) of FIG. 2.

Figure 6:
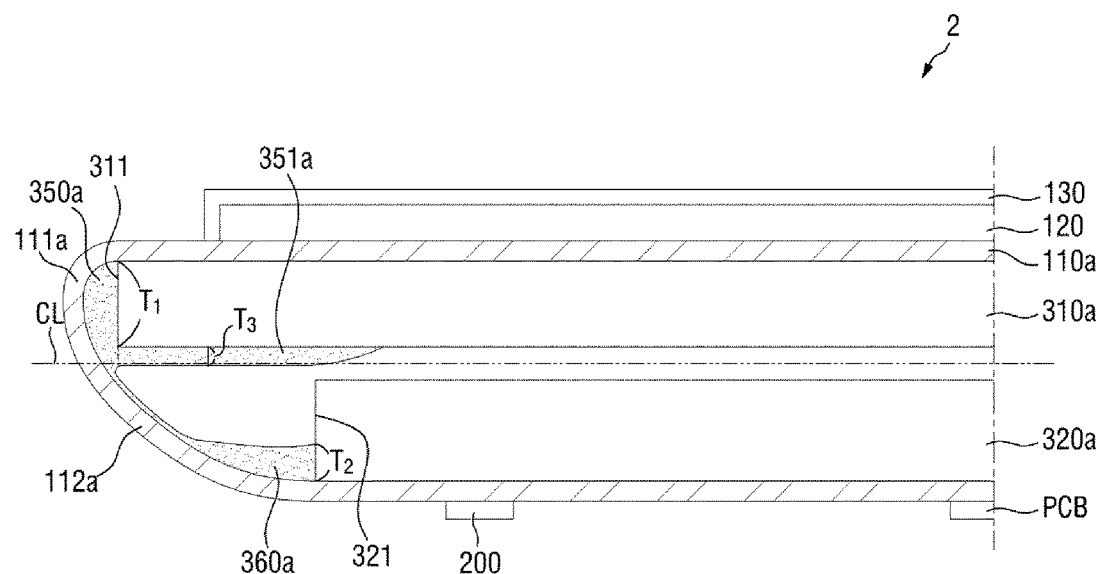
FIG. 6 is a cross-sectional view of another exemplary embodiment of a flexible display device in a bent state according to the present disclosure.

FIG. 6 is a cross-sectional view of another exemplary embodiment of a flexible display device in a bent state according to the present disclosure.

Referring to FIG. 6, a flexible display device 2 differs from the flexible display device 1 of FIGS. 2 through 5 in that a first buffer member 350a is disposed to extend over to a first back plate 310a when a flexible substrate 110a is bent.

Specifically, the first buffer member 350a may include or define a first extension member 351a extending over to the bottom of the first back plate 310a from an end of the bent flexible display device 2. That is, the first extension member 351a may extend from the first buffer member 350a and may be disposed on the bottom surface of the first back plate 310a, such as being disposed directly on the bottom surface of the first back plate 310a. The first extension member 351a may have a thickness $T_3$ in a thickness direction of the flexible display device 2. A maximum thickness $T_1$ of the first buffer member 350a, which includes or extends to define the first extension member 351a, may be greater than a maximum thickness $T_2$ of a second buffer member 360a and may also be greater than the thickness of the first back plate 310a. In this case, the first extension member 351a may overlap with a part of a second back plate 320a in the thickness direction. When the flexible substrate 110a is bent, the first extension member 351a can minimize interference between the bottom surface of the first back plate 310a and the bottom surface of the second back plate 320a, which is disposed at the bottom of the first back plate 310a, and can mitigate shock transmitted between the first and second back plates 310a and 320a.

In the exemplary embodiment of FIG. 6, like in the exemplary embodiment of FIGS. 2 through 5, an asymmetric buffer member (350a and 351a) may be used. That is, the stress applied to the first flexible substrate 111a may be greater when the flexible substrate 110a is bent asymmetrically than when the flexible substrate 110a is bent symmetrically. Also, the stress applied to the first flexible substrate 111a may be greater than the stress applied to the second flexible substrate 112a.

Since the average bending angle, the average bending slope, and the average curvature of the first flexible substrate 111a are greater than the average bending angle, the average bending slope, and the average curvature of the second flexible substrate 112a, the first flexible substrate 111a may be bent to a greater extent than the second flexible substrate 112a. Accordingly, when the flexible substrate 110a is bent, the first flexible substrate 111a may receive more stress than the second flexible substrate 112a. Also, since the first flexible substrate 111a has a relatively strong contact force with a first contact 111P of a first inner surface 311a of the first back plate 310a, the first flexible substrate 111a may receive more stress than the second flexible substrate 112a. That is, the stress applied to the flexible substrate 110a may be greater in the first flexible substrate 111a than in the second flexible substrate 112a. As a result, cracks may be generated in signal wiring on the first flexible substrate 111a, and eventually, the signal wiring may be disconnected.

However, since the buffer member (350a and 360a) is applied asymmetrically to the flexible substrate 110a, the stress caused by the asymmetric bending of the flexible substrate 110a can be alleviated. In addition, the buffer member (350a and 360a) can reduce or effectively prevent peeling of the flexible substrate 110a and a back plate (310a and 320a) from each other, and can also reduce or effectively prevent the penetration of moisture between the flexible substrate 110a and the back plate (310a and 320a). Specifically, since the average thickness and the volume of the first buffer member 350a are greater than the average thickness and the volume of the second buffer member 360a, the first buffer member 350a can properly perform a buffer function while guiding the bending of the first flexible substrate 111a, which receives more stress than the second flexible substrate 112a. Accordingly, a reliable flexible display device can be provided by reducing or effectively preventing the disconnection of the signal wiring.

Figure 7:
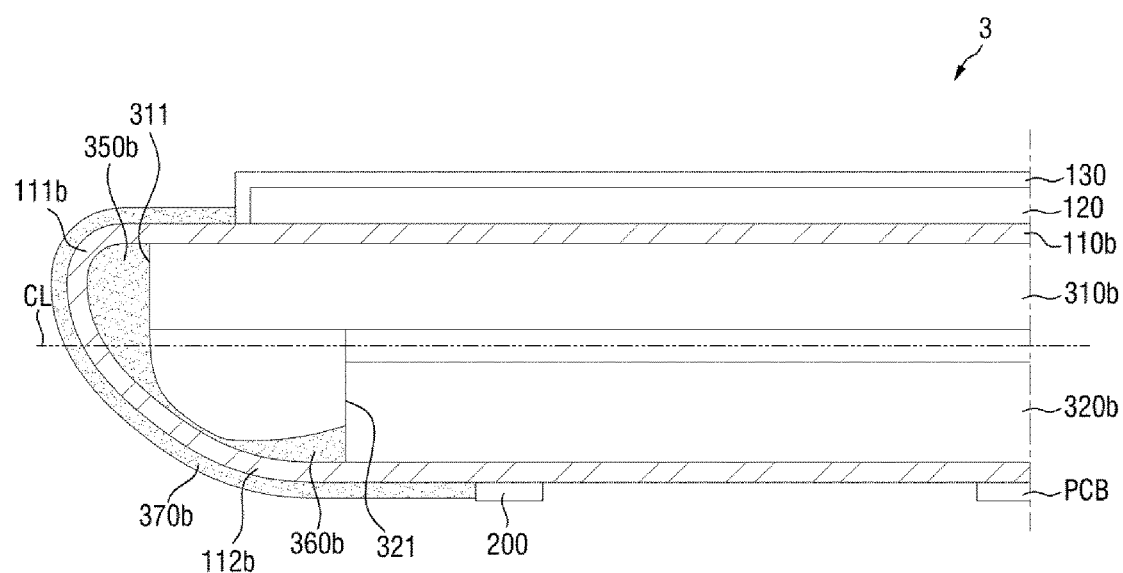
FIG. 7 is a cross-sectional view of still another exemplary embodiment of a flexible display device in a bent state according to the present disclosure.
Figure 8:
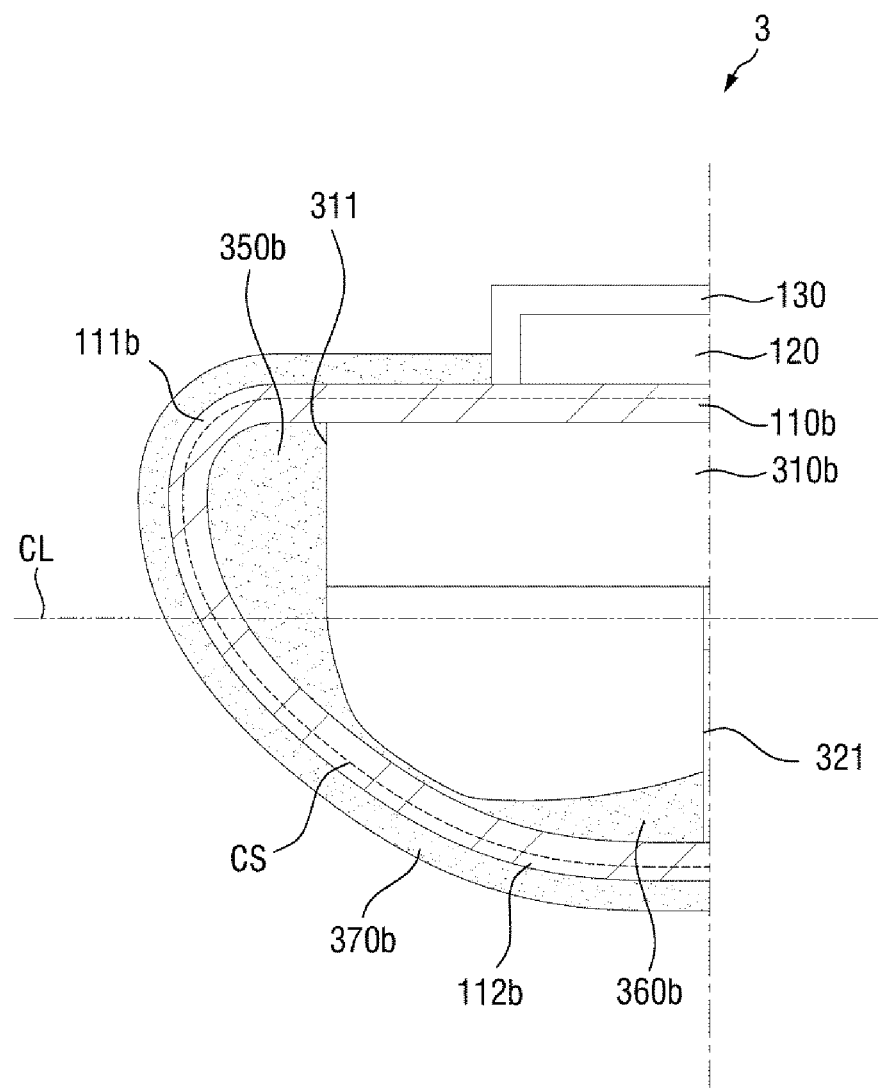
FIG. 8 is an enlarged cross-sectional view of the flexible display device of FIG. 7.

FIG. 7 is a cross-sectional view of still another exemplary embodiment of a flexible display device in a bent state according to the present disclosure, and FIG. 8 is an enlarged cross-sectional view of the flexible display device of FIG. 7.

Referring to FIGS. 7 and 8, a flexible display device 3 differs from the flexible display device 1 of FIGS. 2 through 5 in that it further includes a third buffer member 370b disposed on the top surface of a flexible substrate 110b in a bending area BA.

Specifically, the flexible display device 3 may include first and second buffer members 350b and 360b and may further include the third buffer member 370b. The third buffer member 370b may be disposed on the flexible substrate 110b to face the first and second buffer members 350b and 360b. The third buffer member 370b may be disposed on the top surface of the flexible substrate 110b. Specifically, the third buffer member 370b may cover the top surfaces of first and second flexible substrates 111b and 112b, but the present disclosure is not limited thereto. Alternatively, the third buffer member 370b may further extend to the outside of the first and second flexible substrates 111b and 112b.

When the flexible substrate 110b is bent, a plane where strain caused by the bending of the flexible substrate 110b substantially becomes zero may be defined as a neutral plane CS. The neutral plane CS may be formed by the third buffer member 370b, which faces the first and second buffer members 350b and 360b disposed on the top surface and the bottom surface, respectively, with respect to the flexible substrate 110b.

When the third buffer member 370b is used, signal wiring disposed in a display area DA and a part of a non-display area NDA of the flexible substrate 110b can be essentially placed on the neutral plane CS by the first, second, and third buffer members 350b, 360b, and 370b.

The first, second, and third buffer members 350b, 360b, and 370b may include or be formed of the same material, but the present disclosure is not limited thereto.

Alternatively, the first, second, and third buffer members 350b, 360b, and 370b may include or be formed of different materials. In this case, the lengths, thicknesses, and elasticity moduli of the first, second, and third buffer members 350b, 360b, and 370b may be adjusted so as to place the signal wiring on the neutral plane CS. In an exemplary embodiment, for example, the first and second buffer members 350b and 360b may be thicker than the third buffer member 370b, but may have a lower elasticity modulus than the third buffer member 370b so that the signal wiring in the non-display area NDA of the flexible substrate 110b can be placed on the neutral plane CS by the first, second, and third buffer members 350b, 360b, and 370b. Thicknesses of the first, second, and third buffer members 350b, 360b, and 370b may be taken in a substantially normal direction to the flexible substrate 110b at respective positions along the flexible substrate 110b.

The length and the thickness of the third buffer member 370b may be designed in various manners in comparison to the lengths and the thicknesses of the first and second buffer members 350b and 360b. In an exemplary embodiment, for example, the third buffer member 370b may be thinner than the first and second buffer members 350b and 360b, and the maximum thickness of the third buffer member 370b may be smaller than the maximum thicknesses of the first and second buffer members 350b and 360b. In this example, the third buffer member 370b may have a higher elasticity modulus than the first and second buffer members 350b and 360b, but the present disclosure is not limited thereto.

In the exemplary embodiment of FIGS. 7 and 8, like in the exemplary embodiments of FIGS. 2 through 5 and FIG. 6, an asymmetric buffer member (350b and 360b) may be used. That is, the stress applied to the first flexible substrate 111b may be greater when the flexible substrate 110b is bent asymmetrically than when the flexible substrate 110b is bent symmetrically. Also, the stress applied to the first flexible substrate 111b may be greater than the stress applied to the second flexible substrate 112b.

Since the average bending angle, the average bending slope, and the average curvature of the first flexible substrate 111b are greater than the average bending angle, the average bending slope, and the average curvature of the second flexible substrate 112b, the first flexible substrate 111b may be bent to a greater extent than the second flexible substrate 112b. Accordingly, when the flexible substrate 110b is bent, the first flexible substrate 111b may receive more stress than the second flexible substrate 112b. Also, since the first flexible substrate 111b has a relatively strong contact force with a first contact 111P of a first inner surface 311b of the first back plate 310b, the first flexible substrate 111b may receive more stress than the second flexible substrate 112b. That is, the stress applied to the flexible substrate 110b may be greater in the first flexible substrate 111b than in the second flexible substrate 112b. As a result, cracks may be generated in signal wiring on the first flexible substrate 111b, and eventually, the signal wiring may be disconnected.

However, since the buffer member (350b and 360b) is applied asymmetrically to the flexible substrate 110b, the stress caused by the asymmetric bending of the flexible substrate 110b can be alleviated. In addition, the buffer member (350b and 360b) can reduce or effectively prevent peeling of the flexible substrate 110b and a back plate (310b and 320b) from each other, and can also reduce or effectively prevent the penetration of moisture between the flexible substrate 110b and the back plate (310b and 320b). Specifically, since the average thickness and the volume of the first buffer member 350b are greater than the average thickness and the volume of the second buffer member 360b, the first buffer member 350b can properly perform a buffer function while guiding the bending of the first flexible substrate 111b, which receives more stress than the second flexible substrate 112b. Accordingly, a reliable flexible display device can be provided by reducing or effectively preventing the disconnection of the signal wiring.

Figure 9:
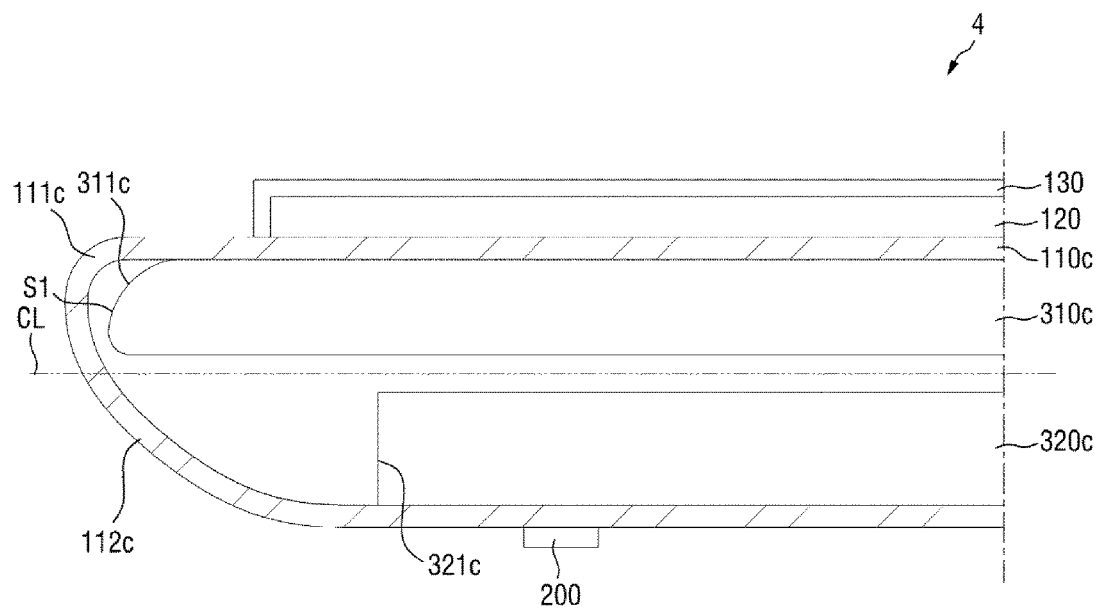
FIG. 9 is a cross-sectional view of yet another exemplary embodiment of a flexible display device in a bent state according to the present disclosure.

FIG. 9 is a cross-sectional view of yet another exemplary embodiment of a flexible display device in a bent state according to the present disclosure.

Referring to FIG. 9, a flexible display device 4 differs from the flexible display device 1 of FIGS. 2 through 5 in that it includes a first back plate 310c including a first curved surface S1 on a first inner side 311c thereof, but does not include a buffer member.

Specifically, the first back plate 310c may include the first curved surface S1, to which a first curvature (CV1) is applied, on the first inner side 311c, which protrudes toward a first flexible substrate 111c. FIG. 9 illustrates that the first inner side 311c of the first back plate 310c includes the first curved surface S1, to which the first curvature (CV1) is applied, and no curvature is applied to the second inner side 321c of the second back plate 320c, but the present disclosure is not limited thereto. Alternatively, the second back plate 320c may include a second curved surface, to which the second curvature (CV2) is applied, on the second inner side 321c, which protrudes toward a second flexible substrate 112c.

The first curved surface S1 of the first inner side 311c is illustrated as having a semicircular shape, but the present disclosure is not limited thereto. Alternatively, the first curved surface S1 of the first inner side 311c may have a quadrant shape to which the first curvature (CV1) is applied, and the second curved surface of the second inner side 321c may have a quadrant shape to which the second curvature (CV2) is applied.

The first and second curvatures (CV1 and CV2) may be designed in consideration of various factors such as the type of the flexible substrate 110c, the degree to which the flexible substrate 110c is bent, and the material, the thickness, and the elasticity modulus of a buffer member. Thus, the first and second curvatures (CV1 and CV2) may be the same or may be different. In the exemplary embodiment of FIG. 9, the first curvature (CV1) may be greater than the second curvature (CV2).

When the first and second back plates 310c and 320c having the first and second curvatures (CV1 and CV2), respectively, are used, stress can be considerably reduced when the flexible substrate 110c is placed in contact with the first and second back plates 310c and 320c. Particularly, in an asymmetric bending structure, the stress of the first flexible substrate 111c can be reduced by making the first curvature (CV1) greater than the second curvature (CV2).

Specifically, by making the first curvature (CV1) of the first back plate 310c greater than the second curvature (CV2) of the second back plate 320c, the stress of the first flexible substrate 111c, which is more stressed than the second flexible substrate 112c, can be reduced, and the disconnection of signal wiring can be reduced or effectively prevented. Accordingly, a reliable flexible display device can be provided.

Figure 10:
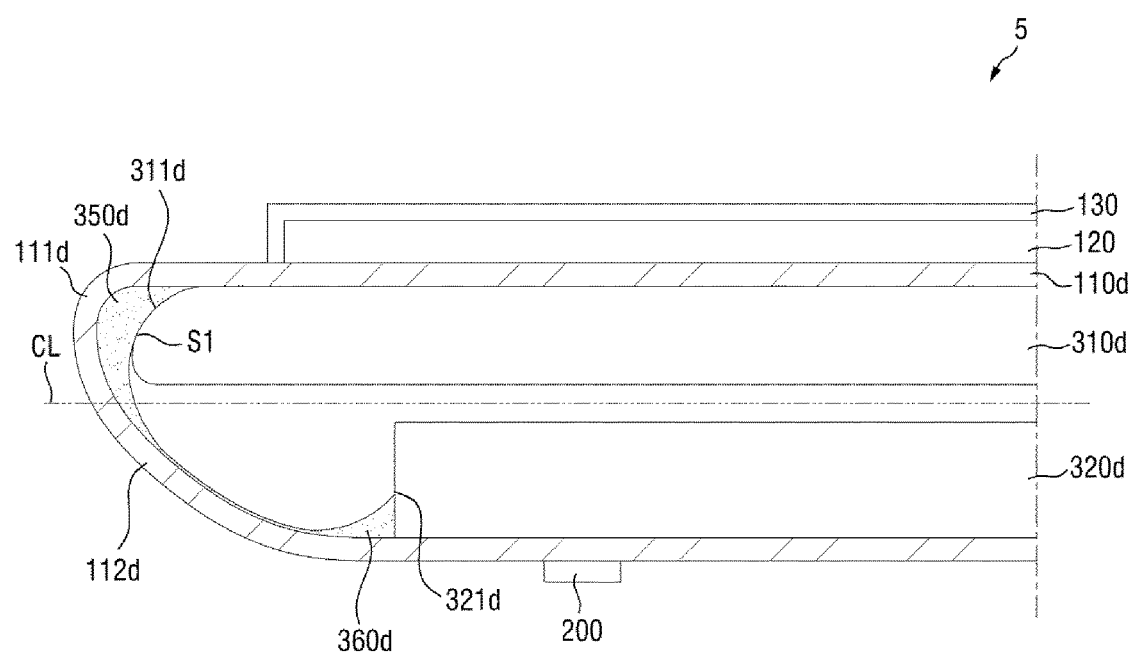
FIG. 10 is a cross-sectional view of yet another exemplary embodiment of a flexible display device in a bent state according to the present disclosure.

FIG. 10 is a cross-sectional view of yet another exemplary embodiment of a flexible display device in a bent state according to the present disclosure.

Referring to FIG. 10, a flexible display device 5 differs from the flexible display device 1 of FIGS. 2 through 5 in that it includes a first back plate 310d including a first curved surface S1 on a first inner side 311d thereof.

FIG. 10 illustrates that the first inner side 311d of the first back plate 310d includes the first curved surface S1, to which the first curvature (CV1) is applied, and no curvature is applied to the second inner side 321d of the second back plate 320d, but the present disclosure is not limited thereto. Alternatively, the second back plate 320d may include a second curved surface, to which the second curvature (CV2) is applied, on the second inner side 321d, which protrudes toward a second flexible substrate 112d. The first curved surface S1 of the first back plate 310d and the second curved surface of the second back plate 320d are as described above with reference to FIG. 9, and thus, detailed descriptions thereof will be omitted.

The flexible display device 5 may further include a buffer member (350d and 360d) in contact with the first and second back plates 310d and 320d, to which first and second curvatures (CV1 and CV2), respectively, are applied.

The thickness of a part of a first buffer member 350d that is in contact with the first curved surface S1 of the first inner side 311d of the first back plate 310d may be greater than the thickness of a part of a second buffer member 360d that is in contact with the second inner side 321d of the second back plate 320d.

FIG. 10 illustrates that the first inner side 311d of the first back plate 310d includes the first curved surface S1, to which the first curvature (CV1) is applied, and no curvature is applied to the second inner side 321d of the second back plate 320d, but the present disclosure is not limited thereto. Alternatively, the second back plate 320d may include a second curved surface, to which the second curvature (CV2) is applied, on the second inner side 321d, which protrudes toward a second flexible substrate 112d.

The first and second buffer members 350d and 360d and the first and second back plates 310d and 320d may include the same material and may be formed in one integral body with one another.

As described above with reference to FIG. 6, the first buffer member 350d may include or define a first extension member (351a in FIG. 6) extending over to the bottom of the first back plate 310d. That is, the first extension member may extend from the first buffer member 350d and may be disposed on the bottom surface of the first back plate 310d, such as being disposed directly on the bottom surface of the first back plate 310d. The first extension member may have a thickness ($T_3$ in FIG. 6) in a thickness direction of the flexible display device 5. A maximum thickness ($T_1$ in FIG. 6) of the first buffer member 350d, which includes or defines the first extension member, may be greater than a maximum thickness ($T_2$ in FIG. 6) of the second buffer member 360d and may also be greater than the thickness of the first back plate 310d.

As described above with reference to FIGS. 2 through 5, the buffer member (350d and 360d) may be applied asymmetrically.

Due to the asymmetric bending of a flexible substrate 110d, the stress applied to the first flexible substrate 111d may be greater when the flexible substrate 110d is bent asymmetrically than when the flexible substrate 110d is bent symmetrically. Also, the stress applied to the first flexible substrate 111d may be greater than the stress applied to the second flexible substrate 112d.

Since the average bending angle, the average bending slope, and the average curvature of the first flexible substrate 111d are greater than the average bending angle, the average bending slope, and the average curvature of the second flexible substrate 112d, the first flexible substrate 111d may be bent to a greater extent than the second flexible substrate 112d. Accordingly, when the flexible substrate 110d is bent, the first flexible substrate 111d may receive more stress than the second flexible substrate 112b. Also, since the first flexible substrate 111d has a relatively strong contact force with a first contact 111P of the first inner surface 311d of the first back plate 310d, the first flexible substrate 111d may receive more stress than the second flexible substrate 112d. That is, the stress applied to the flexible substrate 110d may be greater in the first flexible substrate 111d than in the second flexible substrate 112d. As a result, cracks may be generated in signal wiring on the first flexible substrate 111d, and eventually, the signal wiring may be disconnected.

When the first and second back plates 310d and 320d having the first and second curvatures (CV1 and CV2), respectively, are used, stress can be considerably reduced when the flexible substrate 110d is placed in contact with the first and second back plates 310d and 320d. Particularly, in an asymmetric bending structure, the stress of the first flexible substrate 111d can be reduced by making the first curvature (CV1) greater than the second curvature (CV2).

Figure 11:
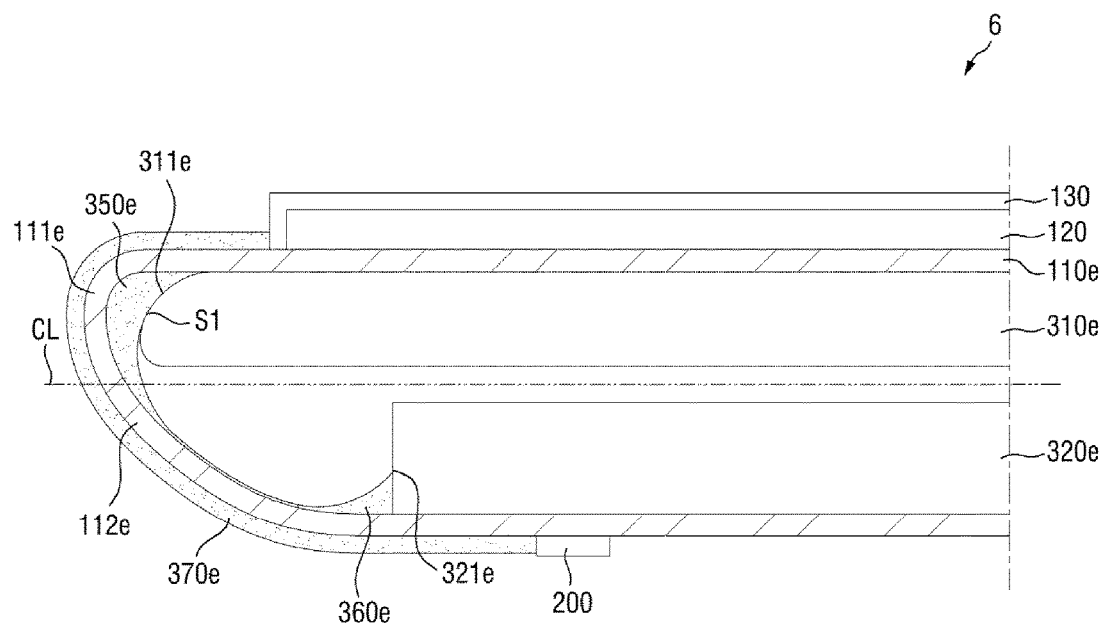
FIG. 11 is a cross-sectional view of yet another exemplary embodiment of a flexible display device in a bent state according to the present disclosure.

FIG. 11 is a cross-sectional view of yet another exemplary embodiment of a flexible display device in a bent state according to the present disclosure.

Referring to FIG. 11, a flexible display device 6 differs from the flexible display device 1 of FIGS. 2 through 5 in that it includes a first back plate 310e including a first curved surface S1 on a first inner side 311e thereof where a second back plate 320e includes a second inner side 321e thereof, and further includes a third buffer member 370e on the top surface of a flexible substrate 110e. The third buffer member 370e, which is disposed on the top surface of the flexible substrate 110e to face first and second buffer members 350e and 360e, is as described above with reference to FIGS. 7 and 9, and thus, a detailed description thereof will be omitted.

As described above with reference to FIGS. 7 and 8, when the third buffer member 370e is used, signal wiring disposed in a display area DA and a part of a non-display area NDA of the flexible substrate 110e can be placed on a neutral plane CS by the first, second, and third buffer members 350e, 360e, and 370e.

In the exemplary embodiment of FIG. 11, like in the exemplary embodiments of FIGS. 2 through 5, FIG. 6, and FIGS. 7 and 8, an asymmetric buffer member (350e and 360e) may be used. That is, the stress applied to a first flexible substrate 111e may be greater when the flexible substrate 110e is bent asymmetrically than when the flexible substrate 110e is bent symmetrically. Also, the stress applied to the first flexible substrate 111e may be greater than the stress applied to a second flexible substrate 112e.

Since the average bending angle, the average bending slope, and the average curvature of the first flexible substrate 111e are greater than the average bending angle, the average bending slope, and the average curvature of the second flexible substrate 112e, the first flexible substrate 111e may be bent to a greater extent than the second flexible substrate 112e. Accordingly, when the flexible substrate 110e is bent, the first flexible substrate 111e may receive more stress than the second flexible substrate 112e. Also, since the first flexible substrate 111e has a relatively strong contact force with a first contact 111P of a first inner surface 311e of the first back plate 310e, the first flexible substrate 111e may receive more stress than the second flexible substrate 112e. That is, the stress applied to the flexible substrate 110e may be greater in the first flexible substrate 111e than in the second flexible substrate 112e. As a result, cracks may be generated in signal wiring on the first flexible substrate 111e, and eventually, the signal wiring may be disconnected.

However, since the buffer member (350e and 360e) is applied asymmetrically to the flexible substrate 110e, the stress caused by the asymmetric bending of the flexible substrate 110e can be alleviated. In addition, the buffer member (350e and 360e) can reduce or effectively prevent peeling of the flexible substrate 110e and a back plate (310e and 320e) from each other, and can also reduce or effectively prevent the penetration of moisture between the flexible substrate 110e and the back plate (310e and 320e). Specifically, since the average thickness and the volume of the first buffer member 350e are greater than the average thickness and the volume of the second buffer member 360e, the first buffer member 350e can properly perform a buffer function while guiding the bending of the first flexible substrate 111e, which receives more stress than the second flexible substrate 112e. Accordingly, a reliable flexible display device can be provided by reducing or effectively preventing the disconnection of the signal wiring 150e.

Although the exemplary embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A display device comprising:
   a flexible substrate including:
      a bending area corresponding to an area at which the display device is bent, and
      a first area and a second area which is spaced apart from the first area by the bending area;
   a display element unit which is controlled to display an image, the display element unit disposed on the flexible substrate in the first area of the flexible substrate; and
   a buffer member disposed on the flexible substrate in the bending area of the flexible substrate, wherein the buffer member in the bending area includes:
      a first buffer member having a first maximum thickness, and a second buffer member having a second maximum thickness which is smaller than the first maximum thickness, and
      among the first buffer member and the second member, the first buffer member disposed closer to the first area and the second member disposed closer to the second area.

2. The display device of claim 1, further comprising on a same side of the flexible substrate which is opposite to that on which the display element unit is disposed:
   a first supporting member coupled to the first area of the flexible substrate; and
   a second supporting member coupled to the second area of the flexible substrate, a first inner side of the first supporting member facing a second inner side of the second supporting member,
   wherein the flexible substrate bent at the bending area disposes along a thickness direction of the display device:
      the second supporting member overlapping the first supporting member,
      the first inner side of the first supporting member corresponding to a border between the first area of the flexible substrate and the first buffer member, and
      the second inner side of the second supporting member corresponding to a border between the second area of the flexible substrate and the second buffer member.

3. The display device of claim 2, wherein
   the first buffer member is in contact with the first inner side of the first supporting member,
   the second buffer member is in contact with the second inner side of the second supporting member, and
   a thickness of a portion of the first buffer member which is directly adjacent to and in contact with the first inner side of the first supporting member is greater than a thickness of a portion of the second buffer member which is directly adjacent to and in contact with the second inner side of the second supporting member.

4. The display device of claim 3, wherein the first supporting member, the first buffer member, the second buffer member and the second supporting member include a same material and form one integral body with one another.

5. The display device of claim 4, wherein
   the first and second buffer members further include a moisture permeation preventing material, and
   in the bending area:
      the first buffer member covers a portion of the flexible substrate directly adjacent to the first inner side of the first supporting member, and
      the second buffer member covers a portion of the flexible substrate directly adjacent to the second inner side of the second supporting member.

6. The display device of claim 5, wherein each of the first and second supporting members are thicker than each of the first and second buffer members.

7. The display device of claim 5, wherein
   the flexible substrate bent at the bending area further disposes:
      the first buffer member at a bent end of the display device, and a bottom surface of the first supporting member facing a top surface of the second supporting member along the thickness direction of the display device, and the first buffer member extends from the bent end of the display device to dispose a first extension member thereof overlapping the bottom surface of the first supporting member along the thickness direction of the display device.

8. The display device of claim 7, wherein the first maximum thickness of the first buffer member extending to define the first extension member is greater than a thickness of the first supporting member.

9. The display device of claim 8, wherein the flexible substrate bent at the bending area further disposes the first extension member further overlapping the top surface of the second supporting member along the thickness direction of the display device.

10. The display device of claim 6, further comprising:
on a same side of the flexible substrate on which the display element unit is disposed, a driving member which controls the display element unit to display the image, the driving member disposed in the second area of the flexible substrate; and
a circuit board which provides a control signal to the driving member, the circuit board connected to the flexible substrate at the second area thereof to be spaced apart from the driving member in the second area.

11. The display device of claim 2, further comprising on a same side of the flexible substrate on which the display element unit is disposed, a third buffer member disposed in the first and second areas of the flexible substrate, the third buffer member facing the first and second buffer members in the bending area of the flexible substrate.

12. The display device of claim 11, wherein
a thickness of the third buffer member is smaller than each of the first and second maximum thicknesses of the first and second buffer members, and
a material of the third buffer member differs from materials of the first and second buffer members.

13. A display device comprising:
a flexible substrate including:
a bending area corresponding to an area at which the display device is bent, and
a first area and a second area which is spaced apart from the first area by the bending area;
a display element unit which is controlled to display an image, the display element unit disposed on the flexible substrate in the first area of the flexible substrate;
a buffer member disposed on the flexible substrate in the bending area of the flexible substrate, the buffer member in the bending area including:
a first buffer member having a first maximum thickness, and a second buffer member having a second maximum thickness which is smaller than the first maximum thickness, and
among the first buffer member and the second member, the first buffer member disposed closer to the first area and the second member disposed closer to the second area; and
on a same side of the flexible substrate which is opposite to that on which the display element unit is disposed:
a first supporting member coupled to the first area of the flexible substrate, the first supporting member including a first inner side closest to the bending area being curved to have a first curvature; and a second supporting member coupled to the second area of the flexible substrate, the second supporting member including a second inner side closest to the bending area, wherein the flexible substrate bent at the bending area disposes along a thickness direction of the display device:
the second supporting member overlapping the first supporting member, and
the curved first inner side of the first supporting member protruding toward the first buffer member.

14. The display device of claim 13, wherein
the first buffer member is in contact with the curved first inner side of the first supporting member,
the second buffer member is in contact with the second inner side of the second supporting member, and
a thickness of a portion of the first buffer member which is directly adjacent to and in contact with the curved first inner side is greater than a thickness of a portion of the second buffer member which is directly adjacent to and in contact with the second inner side.

15. The display device of claim 14, wherein the first supporting member, the first buffer member, the second buffer member and the second supporting member include a same material and form one integral body with one another.

16. The display device of claim 15, wherein
the first and second buffer members further include a moisture permeation preventing material, and
in the bending area:
the first buffer member covers a portion of the flexible substrate directly adjacent to the curved first inner side, and
the second buffer member covers a portion of the flexible substrate directly adjacent to the second inner side.

17. The display device of claim 16, wherein each of the first and second supporting members are thicker than each of the first and second buffer members.

18. The display device of claim 16, wherein
the flexible substrate bent at the bending area further disposes:
the first buffer member at a bent end of the display device, and
a bottom surface of the first supporting member facing a top surface of the second supporting member along the thickness direction of the display device,
the first buffer member extends from the bent end of the display device to dispose a first extension member thereof overlapping both the bottom surface of the first supporting member and the top surface of the second supporting member along the thickness direction of the display device, and
the first maximum thickness of the first buffer member extending to define the first extension member is greater than a thickness of the first supporting member.

19. The display device of claim 13, further comprising on a same side of the flexible substrate on which the display element unit is disposed, a third buffer member disposed in the first and second areas of the flexible substrate, the third buffer member facing the first and second buffer members in the bending area of the flexible substrate.

20. The display device of claim 19, wherein
a thickness of the third buffer member is smaller than each of the first and second maximum thicknesses of the first and second buffer members, and a material of the third buffer member differs from materials of the first and second buffer members.

\* \* \* \* \*